US011416228B2

(12) United States Patent
Chong et al.

(10) Patent No.: US 11,416,228 B2
(45) Date of Patent: Aug. 16, 2022

(54) SYSTEM AND METHOD OF OPTIMIZING INSTRUCTIONS FOR QUANTUM COMPUTERS

(71) Applicant: University of Chicago, Chicago, IL (US)

(72) Inventors: Frederic T. Chong, Chicago, IL (US); Yunong Shi, I, Chicago, IL (US); Nelson Leung, Chicago, IL (US); Pranav Gokhale, Chicago, IL (US); Henry Hoffmann, Chicago, IL (US); David Schuster, Chicago, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 0 days.

(21) Appl. No.: 17/273,938

(22) PCT Filed: Sep. 12, 2019

(86) PCT No.: PCT/US2019/050870
§ 371 (c)(1),
(2) Date: Mar. 5, 2021

(87) PCT Pub. No.: WO2020/056176
PCT Pub. Date: Mar. 19, 2020

(65) Prior Publication Data
US 2021/0334081 A1    Oct. 28, 2021

Related U.S. Application Data

(60) Provisional application No. 62/773,581, filed on Nov. 30, 2018, provisional application No. 62/730,813, filed on Sep. 13, 2018.

(51) Int. Cl.
*G06F 8/41*    (2018.01)
*G06F 8/10*    (2018.01)
(Continued)

(52) U.S. Cl.
CPC .............. *G06F 8/443* (2013.01); *G06F 9/48* (2013.01); *G06N 10/00* (2019.01); *G06F 8/41* (2013.01);
(Continued)

(58) Field of Classification Search
CPC .. G06N 10/00; G06F 9/48; G06F 8/41; G06F 8/443; G06F 8/47
See application file for complete search history.

(56) References Cited

U.S. PATENT DOCUMENTS

| 8,527,973 B2 | 9/2013 | Little et al. | |
| 11,010,145 B1 * | 5/2021 | Smith | G06F 8/47 |

(Continued)

OTHER PUBLICATIONS

Henry G. Dietz, A Gate-Level Approach to Compiling for Quantum Computers, 2018 IEEE, [Retrieved on Jan. 26, 2022]. Retrieved from the internet: <URL: https://ieeexplore.ieee.org/stamp/stamp.jsp?tp=&arnumber=8752114> 5 Pages (1-5) (Year: 2018).*

(Continued)

*Primary Examiner* — Anibal Rivera
(74) *Attorney, Agent, or Firm* — Armstrong Teasdale LLP

(57) ABSTRACT

A quantum computing system includes a quantum processor having a plurality of qubits, a classical memory, and a classical processor. The classical processor is configured to compile a quantum program into logical assembly instructions in an intermediate language, aggregate the logical assembly instructions together into a plurality of logical blocks of instructions, generate a logical schedule for the quantum program based on commutativity between the plurality of logical blocks, generate a tentative physical schedule based on the logical schedule, the tentative physical schedule includes a mapping of the logical assembly instructions in the logical schedule onto the plurality of qubits of the quantum processor, aggregate instructions together within the tentative physical schedule that do not (Continued)

reduce parallelism, thereby generating an updated physical schedule; generate optimized control pulses for the aggregated instructions, and execute the quantum program on the quantum processor with the optimized control pulses and the updated physical schedule.

21 Claims, 8 Drawing Sheets

(51) Int. Cl.
    *G06N 10/00*    (2022.01)
    *G06F 9/48*    (2006.01)
    *H03K 3/00*    (2006.01)
    *H03K 5/00*    (2006.01)

(52) U.S. Cl.
    CPC ............... *G06F 8/47* (2013.01); *H03K 3/00* (2013.01); *H03K 5/00* (2013.01)

(56) References Cited

U.S. PATENT DOCUMENTS

| | | |
|---|---|---|
| 2009/0254892 A1 | 10/2009 | Yamashita |
| 2013/0036409 A1 | 2/2013 | Auerbach et al. |
| 2019/0164076 A1* | 5/2019 | Kim .................. G06N 10/00 |

OTHER PUBLICATIONS

S. Ramesh Ekanayake, Qubit control-pulse circuits in SOS-CMOS technology for a Si:P quantum computer, 2008, [Retrieved on Jan. 26, 2022]. Retrieved from the internet: <URL: http://unsworks.unsw.edu.au/fapi/datastream/unsworks:4634/SOURCE1?view=true> 152 Pages (1-121) (Year: 2008).*

International Search Report and Written Opinion for PCT/US2019/050870, dated Nov. 26, 2019, 10 pages.

* cited by examiner

SYSTEM AND METHOD OF OPTIMIZING INSTRUCTIONS FOR QUANTUM COMPUTERS

CROSS REFERENCE TO RELATED APPLICATIONS

This application is a U.S. National Stage Entry of International Patent Application No. PCT/US2019/050870, filed Sep. 12, 2019, which claims the benefit of priority to U.S. Provisional Patent Application Ser. No. 62/730,813, entitled SYSTEM AND METHOD FOR COMPILATION OF AGGREGATED INSTRUCTIONS FOR QUANTUM COMPUTERS filed Sep. 13, 2018, and U.S. Provisional Patent Application Ser. No. 62/773,581, entitled SYSTEM AND METHOD OF OPTIMIZING INSTRUCTIONS FOR QUANTUM COMPUTERS filed Nov. 30, 2018, the entire contents of which are incorporated herein by reference in their entireties.

STATEMENT REGARDING FEDERALLY SPONSORED RESEARCH & DEVELOPMENT

This invention was made with government support under grant numbers CCF1730449, and PHY1660686 awarded by The National Science Foundation. The government has certain rights in the invention.

TECHNICAL FIELD

This disclosure relates generally to quantum computing and, more specifically, to systems and methods for compiling aggregated instructions for quantum computers.

BACKGROUND

Recent developments in quantum computing have pushed quantum computers closer to solving classically intractable problems. Existing quantum programming languages and compilers use a quantum assembly language composed of 1- and 2-quantum bit ("qubit") gates to prepare and execute primitive operations on quantum computers. Recent advancements in hardware and software include devices such as IBM's 50-qubit quantum machine and Google's 72-qubit machine, as well as classical-quantum hybrid algorithms tailored for such Noisy Intermediate-Scale Quantum ("NISQ") machines, such as Quantum Approximate Optimization Algorithm ("QAOA") and Variational Quantum Eigensolver ("VQE").

Computation latency is a major challenge for near-term quantum computing. While conventional computing systems may generally benefit from reduced latency (e.g., for modest performance improvements provided by faster processing), latency presents an existential threat to quantum computing. In a quantum system, output fidelity decays at least exponentially with latency. Thus, in near-term quantum computers, reducing latency is not just a minor convenience. Rather, latency reduction actually enables new computations on near-term machines by ensuring that the computation finishes before the qubits decohere and produce a useless result.

Unfortunately, existing quantum computing abstractions that mirror classical computer system stacks introduce inefficiencies that greatly impact latency. In those conventional gate-based approaches, programs are compiled into quantum assembly instructions (e.g., gates) that utilize 1- and 2-qubit operations. Such a quantum assembly represents a virtual instruction set architecture ("ISA") which provides a limited but universal set of operations into which decomposition algorithms exist. These gates must then be translated into control pulses, the electrical signals that implement the specified operations on the underlying physical hardware. However, the underlying hardware typically implements a different set of operations that admit efficient physical implementation regarding the specific architecture. As such, there is a mismatch between the expressive logical gates and the set of instructions that can be efficiently implemented on the underlying quantum computing system.

What is needed is a quantum compilation technique that optimizes across existing abstraction barriers to reduce latency while still being practical for large numbers of qubits.

BRIEF DESCRIPTION

In one aspect, a quantum computing system for compiling and executing instructions on a quantum computer is provided. The quantum computing system includes the quantum processor including a plurality of qubits. The quantum computing system also includes a classical memory including a quantum program. The quantum program defines a plurality of instructions in a source language. The quantum computing system further includes a classical processor communicatively coupled to the classical memory. The classical memory includes computer-executable instructions that, when executed by the classical processor, cause the classical processor to compile the quantum program into logical assembly instructions in an intermediate language. The instructions also cause the classical processor to aggregate the logical assembly instructions together into a plurality of logical block of instructions. The instructions further cause the classical processor to generate a logical schedule for the quantum program based on commutativity between the plurality of logical blocks. The instructions also cause the classical processor to generate a tentative physical schedule based on the logical schedule. The tentative physical schedule includes a mapping of the logical assembly instructions in the logical schedule onto the plurality of qubits of the quantum processor. The instructions further cause the classical processor to aggregate instructions together within the tentative physical schedule that do not reduce parallelism, thereby generating an updated physical schedule. The instructions also cause the classical processor to generate optimized control pulses for the aggregated instructions of the quantum program. The instructions further cause the classical processor to execute the quantum program on the quantum processor with the optimized control pulses and the updated physical schedule.

In another embodiment, a computer-implemented method for compiling instructions for a quantum computer is provided. The method is implemented using a classical processor in communication with a classical memory. The method includes receiving a quantum program from a user. The quantum program defines a plurality of instructions in a source language. The method also includes compiling the quantum program into logical assembly instructions in an intermediate language. The method further includes aggregating the logical assembly instructions together into a plurality of logical block of instructions. The method also includes generating a logical schedule for the quantum program based on commutativity between the plurality of logical blocks. The method further includes generating a tentative physical schedule based on the logical schedule. The tentative physical schedule includes a mapping of the logical assembly instructions in the logical schedule onto a plurality of qubits of a quantum processor. The method also includes aggregating instructions together in the tentative physical schedule that do not reduce parallelism, thereby generating an updated physical schedule. The method further includes generating optimized control pulses for the aggregated instructions of the quantum program. The method also includes executing the quantum program on the quantum processor with the optimized control pulses and the updated physical schedule.

In yet another embodiment, a non-transitory computer-readable storage media having computer-executable instructions embodied thereon. When executed by at least one classical processor, the computer-executable instructions cause the classical processor to receive a quantum program from a user. The quantum program defines a plurality of instructions in a source language. The computer-executable instructions also cause the classical processor to compile the quantum program into logical assembly instructions in an intermediate language. The computer-executable instructions further cause the classical processor to aggregate the logical assembly instructions together into a plurality of logical block of instructions. The computer-executable instructions also cause the classical processor to generate a logical schedule for the quantum program based on commutativity between the plurality of logical blocks. The computer-executable instructions further cause the classical processor to generate a tentative physical schedule based on the logical schedule. The tentative physical schedule includes a mapping of the logical assembly instructions in the logical schedule onto a plurality of qubits of a quantum processor. The computer-executable instructions also cause the classical processor to aggregate instructions together in the tentative physical schedule that do not reduce parallelism, thereby generating an updated physical schedule. The computer-executable instructions further cause the classical processor to generate optimized control pulses for the aggregated instructions of the quantum program. The computer-executable instructions also cause the classical processor to execute the quantum program on the quantum processor with the optimized control pulses and the updated physical schedule.

BRIEF DESCRIPTION OF THE DRAWINGS

FIGS. 1-5D show exemplary embodiments of the methods and systems described herein.

FIG. 1 is a diagram of exemplary quantum computing system for optimizing instructions for execution on a quantum computing device.

FIG. 2 is a component diagram of the compilation engine shown in FIG. 1.

FIG. 3 is a flow chart illustrating an example method for optimizing the compilation of the quantum program for execution on the quantum computing device shown in FIG. 1.

FIGS. 5A-5D illustrate stages of an example computational graph used by the compilation engine to schedule conflicting instructions.

DETAILED DESCRIPTION OF THE DISCLOSURE

Figure 1:
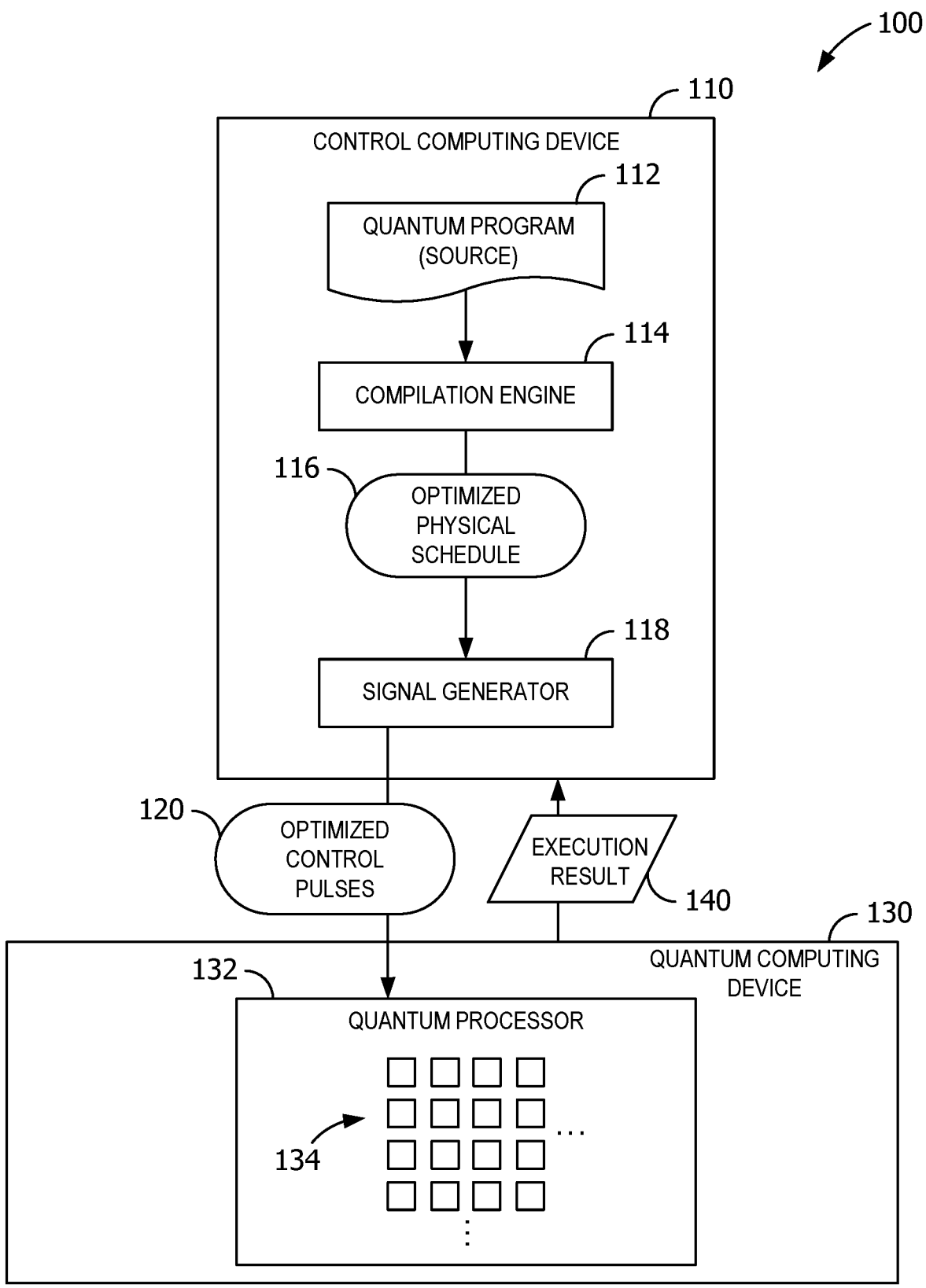

The following detailed description illustrates embodiments of the disclosure by way of example and not by way of limitation. It is contemplated that the disclosure has general application to quantum computing.

Existing quantum programming languages and compilers use a quantum assembly language composed of 1- and 2-qubit gates. Quantum compiler frameworks translate this quantum assembly into control pulses, typically electric signals that implement the specified computation on a specific quantum computing device. However, there are numerous inefficiencies and drawbacks to using classical compilation techniques in the context of quantum computing, as well as new problems not experienced in typical classical computing settings.

A quantum computing system and associated methods are described herein for addressing these problems. The quantum computing system described herein includes a compilation engine (e.g., executed on a classical computing device) that is configured to prepare and optimize a quantum program for execution on a quantum processor. In some instances, the quantum processor may include tens or hundreds of qubits for use in execution, and larger quantum computers are anticipated in the near future. However, optimizing control pulses simultaneously for so many qubits is a computationally complex operation that grows exponentially relative to the number of qubits. Conventional algorithms may not adequate solutions in reasonably bounded pre-processing time, even on the best supercomputers currently available.

As such, the compilation engine provides a compilation framework that both segments the larger problem of scheduling operations on so many qubits into multiple smaller problems (e.g., groupings of qubits and subsets of the program instructions) as well as optimizes those groupings to foster parallelism and to address certain mismatches between the logical instructions of the compilation and the physical constraints of various types of quantum processors. More specifically, the compilation engine performs logical blocking on the logical instructions of the quantum program, grouping the 1- and 2-qubit operations into groups of qubits (e.g., subsets of the entire set of qubits provided by the quantum processor). The size of these groupings may be determined based on a performance threshold of pulse optimization, limiting the group size such that the pulse optimization is able to be sufficiently optimized within a reasonable processing time. For example, it may be determined that the underlying pulse optimization algorithm performs adequately up to approximately ten qubits. As such, for a 50-qubit quantum processor, the compilation engine may break up logical instructions into five 10-qubit blocks, which achieves a reduced order of complexity for pulse optimization, allowing the pulse optimization to be performed on each block within a reasonable processing time.

However, breaking up the logical instructions into multiple blocks can cause problems. For example, if grouped poorly, the grouping can introduce serialization where parallelism may be possible. Further, due to the nature of the underlying quantum hardware, grouping certain kinds of operations together can yield efficiencies (e.g., less number of pulse sequences needed). As such, the compilation engine strategically groups the instructions with these features in mind.

The term "classical," as used herein, refers to conventional transistor-based computing technology. This term, where necessary, is used to distinguish conventional computing devices or associated hardware, software, algorithms, and such, from "quantum" computing. Quantum computing devices or associated hardware, software, algorithms, and such, are typically distinguished from classical computing devices based on their reliance on quantum phenomena of quantum mechanics to perform processing operations. Example classical computing devices include conventional personal computers, servers, tablets, smartphones, x86-based processors, random access memory ("RAM") modules, and so forth. Example quantum computing devices include "IBM Q" devices from International Business Machines (IBM), "Bristlecone" quantum computing device from Google, "Tangle Lake" quantum computing device from Intel, and "2000Q" from D-Wave. The term "classical bit" or "cbit" may be used herein to refer to a bit within classical computing. The term "qubit" may be used herein to refer to a quantum bit in quantum computing.

FIG. 1 is a diagram of exemplary quantum computing system 100 for optimizing instructions for execution on a quantum computing device 130. The quantum computing system 100 includes a control computing device 110 that is configured to prepare (e.g., compile and optimize) a quantum program 112 for execution on the quantum computing device 130. The quantum computing device 130 includes multiple qubits 134 that represent a quantum processor 132 upon which the quantum program 112 is executed. In the example embodiment, the quantum processor 132 includes 50 or 100 qubits, but it should be understood that the present disclosure is envisioned to be operable and beneficial for quantum processors with many tens, hundreds, or more qubits 134.

The qubit 134 is the basic element of a quantum computing device such as the quantum computing device 130 shown in FIG. 1. In contrast to classical bits ("cbits"), qubits are capable of existing in a superposition of logical states, notated herein as $|0\rangle$ and $|1\rangle$. The general quantum state of a qubit may be represented as:

$$|\psi 1\rangle = \alpha|0\rangle + \beta|1\rangle,$$

where $\alpha, \beta$ are complex coefficients with $|\alpha|^2 + |\beta|^2 = 1$. When measured in the 0/1 basis, the quantum state collapses to $|0\rangle$ or $|1\rangle$ with a probability of $|\alpha|^2$ and $|\beta|^2$, respectively. The qubit 134 can be visualized as a point on a 3D sphere called the Bloch sphere. Qubits 134 can be realized on different Quantum Information Processing (QIP) platforms, including ion traps, quantum dot systems, and, in the example embodiment, superconducting circuits. The number of quantum logical states grows exponentially with the number of qubits 134 in the quantum processor 132. For example, a system with three qubits 134 can live in the superposition of eight logical states: $|000\rangle, |001\rangle, |010\rangle, |011\rangle, \ldots, |111\rangle$. This property sets the foundation of potential quantum speedup over classical computation. In other words, an exponential number of correlated logical states can be stored and processed simultaneously by the quantum system 100 with a linear number of qubits 134.

During quantum compilation, the quantum program 112 is first decomposed into a set of 1- and 2-qubit discrete quantum operations called logical quantum gates. These quantum gates are represented in matrix form as unitary matrices. 1-qubit gates correspond to rotations along a particular axis on the Bloch sphere. In an example quantum ISA, the 1-qubit gate set may include rotations along the x-, y-, and z-axes of the Block sphere. Such gates are notated herein as $R_x$, $R_y$, and $R_z$ gates, respectively. Further, the quantum ISA may also include a Hadamard gate, which corresponds to a rotation about the diagonal x+z axis. An example of a 2-qubit logical gate in the quantum ISA is a Controlled-NOT ("CNOT") gate, which flips the state of the target qubit if the control qubit is $|1\rangle$ or leaves the state unchanged if the control qubit is 10). For example, the CNOT gate sends $|10\rangle$ to $|11\rangle$, sends $|11\rangle$ to $|10\rangle$, and preserves the other logical states.

Further, it should be understood that the general logical assembly instructions typically used during compilation of the quantum program 112 were designed without direct consideration for the variations in the types of physical hardware that may be used. As such, there is often a mismatch between the logical instructions and the capabilities of the particular QIP platform. For example, on some QIP platforms, it may not be obvious how to implement the CNOT gate directly on that particular physical platform. As such, a CNOT gate may be further decomposed into physical gates in a standard gate-based compilation. Other example physical quantum gates for various architectures include, for example, in platforms with Heisenberg interaction Hamiltonian, such as quantum dots, the directly implementable 2-qubit physical gate is the $\sqrt{SWAP}$ gate (which implements a SWAP when applied twice). In platforms with ZZ interaction Hamiltonian, such as superconducting systems of Josephson flux qubits and NMR quantum systems, the physical gate is the CPhase gate, which is identical to the CNOT gate up to single qubit rotations. In platforms with XY interaction Hamiltonian, such as capacitively coupled Josephson charge qubits (e.g., transmon qubits), the 2-qubit physical gate is iSWAP gate. For trapped ion platforms with dipole-chain interaction, two popular physical 2-qubit gates are the geometric phase gate and the XX gate.

The quantum processor 132 can be continuously driven by external physical operations to any state in the space spanned by the logical states. The physical operations, called control fields, are specific to the underlying system, with control fields and system characteristics controlling a unique and time-dependent quantity called the Hamiltonian. The Hamiltonian determines the evolution path of the quantum states. For example, in superconducting systems such as the example quantum computing device 130, the qubits 134 can be driven to rotate continuously on the Bloch sphere by applying microwave electrical signals. By varying the intensity of the microwave signal, the speed of rotation of the qubit 134 can be manipulated. The ability to engineer the system Hamiltonian in real time allows the quantum computing system 100 to direct the qubits 134 to the quantum state of interest through precise control of related control fields. Thus, quantum computing may be achieved by constructing a quantum system in which the Hamiltonian evolves in a way that aligns with high probability upon final measurement of the qubits 134. In the context of quantum control, quantum gates can be regarded as a set of pre-programmed control fields performed on the quantum processor 132.

In the example embodiment, the control computing device 110 includes a compilation engine 114 that, during operation, is configured to compile the quantum program 112 (e.g., from source code) into an optimized physical schedule 116. The optimized physical schedule 116 represents a set of control instructions and associated schedule that, when sent to the quantum computing device 130 as optimized control pulses 120 (e.g., the pre-programmed control fields) by a signal generator 118, cause the quantum computing device 130 to execute the quantum program 112, thereby generating an execution result 140. In the example embodiment, the quantum computing device 130 is a super-conducting device and the signal generator 118 is an arbitrary wave generator ("AWG") configured to perform the optimized control pulses 120 on the quantum processor 132 (e.g., via microwave pulses sent to the qubits 134, where the axis of rotation is determined by the quadrature amplitude modulation of the signal and where the angle of rotation is determined by the pulse length of the signal). It should be understood that other quantum computing architectures may have different supporting hardware.

In other words, the compilation engine 114, in the example embodiment, takes the quantum program 112 as input, applying a series of transformations to produce control pulses (e.g., the optimized physical schedule 116) that implement the computation on the quantum computing device 130. Several operational objectives of the compilation engine 114, in the example embodiment, include: (A) breaking up the logical operations of the quantum program 112 into subsets, or blocks of qubits 134 (and their associated operations) such that an internal optimal control unit module (not shown in FIG. 1) is able to generate adequate optimization solutions for the subset of instructions; (B) addressing parallelism problems inherent in breaking up the logical operations into blocks; and (C) optimizing the logical operations based on the strengths and weaknesses of the underlying physical hardware.

Figure 2:
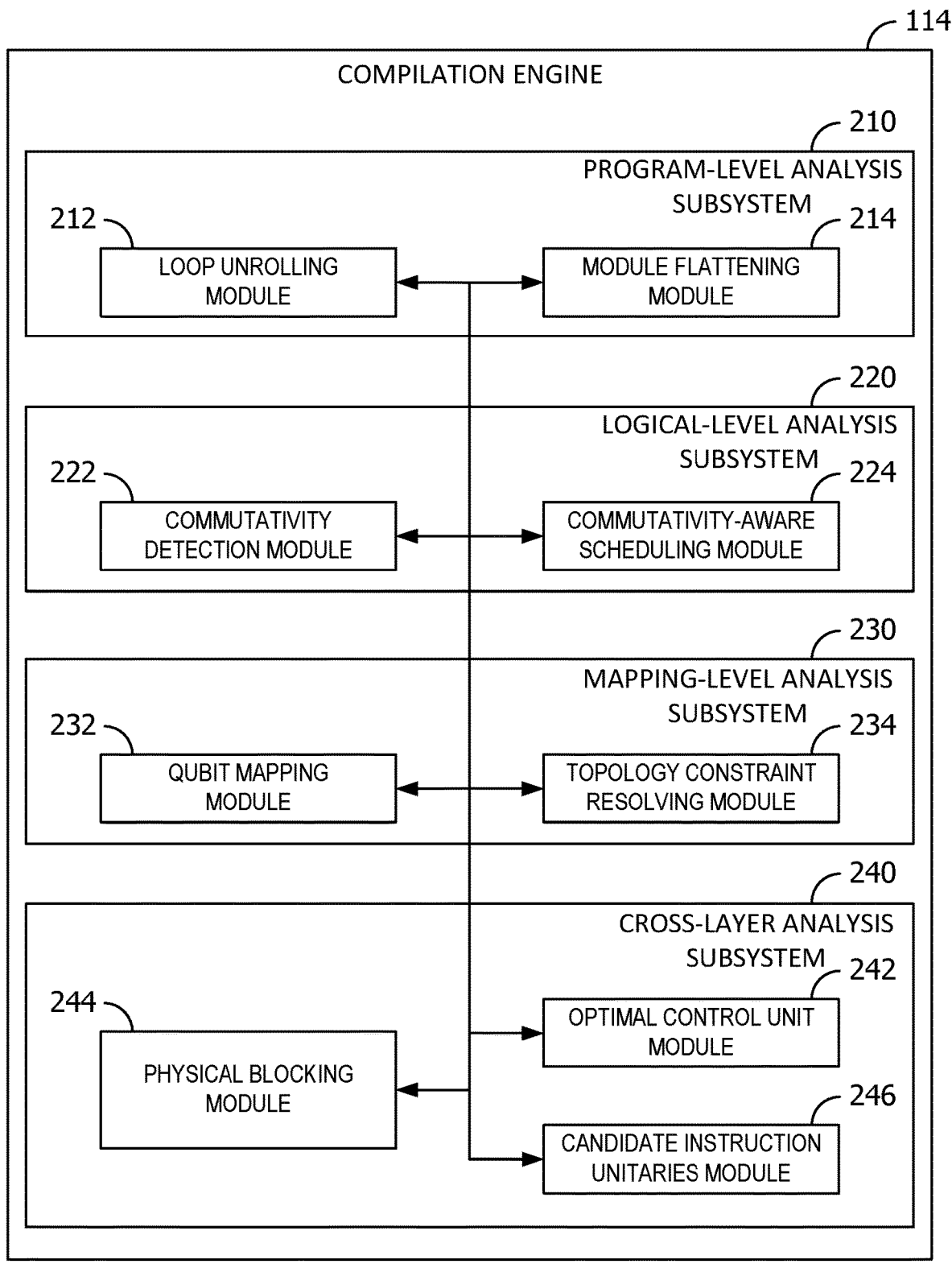

FIG. 2 is a component diagram of the compilation engine 114 shown in FIG. 1. The modules shown in FIG. 2 are organized into subsystems based on their types of processing operations and the level at which the modules perform their operations as the compilation engine 114 compiles the quantum program 112 and prepares the optimized physical schedule 116 for execution. In the example embodiment, the compilation engine 114 includes a program-level analysis subsystem 210 that includes a loop unrolling module 212 and a module flattening module 214. The program-level analysis subsystem 210 compiles the quantum program 112, lowering the high-level descriptions of quantum algorithms to a logical assembly that retains gate dependence relations. In the example embodiment, the logical assembly instructions are Open Quantum Assembly Language (QASM) instructions. Further, the modules of the program-level analysis subsystem perform program-level analysis. More specifically, the loop unrolling module 212 performs loop unrolling on the quantum program 112, expanding loops into serial instructions. With quantum programs, inputs are generally known in advance. As such, the loop unrolling module 212 determines how many times a loop is going to be executed and unpacks those instructions for each iteration. This type of optimization allows better optimization, as more is known about the nature of the instructions earlier in the process than with conventional classical programs. The module flattening module 214 expands a function called by the quantum program, replacing the function name with its contents (e.g., the instructions that perform the function). In the example embodiment, the program-level analysis subsystem 210 uses ScaffCC compiler for various compilation operations, including module flattening.

The program-level analysis module 210 produces logical assembly instructions in an intermediate representation that is passed to a logical-level analysis subsystem 220 for optimization processing at the logical level (e.g., when there is not yet a physical mapping onto actual qubits 134). In the example embodiment, the logical-level analysis subsystem 220 includes a commutativity detection module 222 and a commutativity-aware scheduling module 224. The logical-level analysis subsystem 220 explores commutativity by aggregating highly commutative instructions together into logical instruction blocks (referred to herein as "logical blocking"). Unlike traditional logical scheduling, the logical-level analysis subsystem generates a much more efficient logical schedule by rearranging the highly commutative instructions at the logical level. Some known optimization systems perform commutativity optimization, but at the physical level. However, in near-term quantum applications, it is common for instructions within an instruction block to not commute, but for the full instruction blocks to commute with each other. As such, the commutativity detection module 222 performs commutativity detection at the logical level, forming a highly commutative instruction set for the input quantum circuit. The commutativity-aware scheduling module 224 utilizes commutativity to enable additional logical level optimization with parallelism. More specifically, the commutativity-aware scheduling module 224 finds blocks of instructions that maximize parallelism without concern for cost of swaps (e.g., in quantum architectures where the cost of communication is cheap, such as with superconducting architectures).

From the processing performed by the commutativity detection module 222 and the commutativity-aware scheduling module 224, the logical-level analysis subsystem 220 provides an optimized logical schedule to a mapping-level analysis subsystem 230. In the example embodiment, the mapping-level analysis subsystem assigns the qubits of the logical instructions to particular real qubits 134 of the processor 132 while also performing mapping-level optimizations and constraint resolutions during the process. More specifically, the mapping-level analysis subsystem 230 includes a qubit mapping module 232 and a topology constraint resolving module 234. The logically-scheduled instructions provided by the logical-level analysis subsystem 220 do not account for any topological connectivity constraints of the underlying hardware. In the example embodiment, the quantum processor 132 is a rectangular-grid qubit topology with two-qubit operations only permitted between direct neighbors. The qubit mapping module 232 assigns instructions to particular qubits 134. The qubit mapping module 232 places frequently interacting qubits near each other by bisecting the qubit interaction graph along a cut with few crossing edges. In the example embodiment, the qubit mapping module 232 uses the METIS graph partitioning library, applying this approach recursively on the partitions, yielding a heuristic mapping that reduces the distances of CNOT operations, effectively minimizing distance between things that talk to each other. Once distance has been minimized by the qubit mapping module 232, physical constraints of the underlying hardware are considered with respect to the qubit mapping. For those two-qubit operations in which qubits need to be adjacent but are not (e.g., based on the current schedule and mapping), SWAP operations are introduced to move the control and target qubits to be adjacent.

From the processing performed by the qubit mapping module 232 and the topology constraint resolving module 234, the mapping-level analysis subsystem 230 provides a tentative physical schedule to a cross-layer analysis subsystem 240. In the example embodiment, the cross-layer analysis subsystem 240 is configured to further optimize the tentative physical schedule and generate the optimized control pulses 120 for execution. The cross-layer analysis subsystem 240 includes a physical blocking module 244, a candidate instruction unitaries module 246, and an optimal control unit module 242 that, together, refine the tentative physical schedule into the optimized control pulses 120 with physical blocking and optimal control.

More specifically, the cross-layer analysis subsystem 240 iterates with the optimal control unit module 242 and the physical blocking module 244 to generate the circuit's final aggregated instructions (referred to herein as "physical blocking"). The optimal control unit module 242 optimizes control pulses for each aggregated instruction. More specifically, the optimal control unit module 242 numerically finds the optimal Hamiltonian path from a starting quantum state to a final quantum state. Consider a quantum system with a set of external control fields $u_1, \ldots, u_M$ that can be tuned in real time. Optimal control minimizes deviations from a target state by adjusting each control field u. In the example embodiment, the optimal control unit module 242 utilizes gradient ascent pulse engineering ("GRAPE") algorithm. In GRAPE, at every iteration, the gradient of the target loss function (e.g., usually fidelity) with respect to a control field $u_k$ at time step j in the evolution can be explicitly calculated by solving Schrödinger's equation. A control field $u_k(j)$ will be updated in the direction of the gradient with adaptive step size ε. With enough iterations, the converged control pulses are expected to drive the system from the initial state to the final state along an optimized path. Gradient methods running time and memory use grow exponentially with the size of the quantum system. The computational resources (e.g., time, computer memory, processing operations) required for optimizing circuits grows exponentially. The numerical stability also drops as the number of qubits in the quantum system grows. As such, the present quantum system 100 optimizes quantum processors 132 in groups of up to ten qubits, as optimal control tends to be able to optimize systems of ten qubits efficiently with a practical allocation of computational resources. The optimal control unit module 242 is based on automatic differentiation and a Tensorflow framework. Automatic differentiation allows users to specify advanced optimization criteria and easily incorporate those criteria into pulse generation at this stage (e.g., suppressing unwanted qubit levels, avoiding large voltage fluctuations, and pulse latency).

One challenge of aggregating multi-qubit instructions is a conflict between parallelism and the need for larger instruction size for additional speedup. Aggregating new instructions may potentially compromise parallelism. To protect parallelism, the cross-layer analysis subsystem 240 treats larger aggregated instructions as having more optimized control pulses. Further, the cross-layer analysis subsystem 240 also identifies monotonic actions as actions that will not delay critical paths even if the pulses in the new instruction are not optimized because, in these actions, the reward of reducing circuit latency from aggregating a collection of instructions is strictly higher than aggregating a subset of the collection, as parallelism is not compromised. As such, monotonic actions can be checked by explicitly calculating the original circuit depth with the depth upon executing the action. During physical blocking, the physical blocking module 244 traverses a gate dependence graph ("GDG") used to represent the instructions for the program 112. For each instruction in the GDG, the monotonic action set is searched and the best action is identified and kept in a global table. After traversal of the GDG, the global best action is performed, and the GDG is action table are updated. This is repeated until no more actions can be made. Then the latency of each aggregated instruction is updated by querying the optimal control unit module 242. This updated instruction latency could change the circuit structure and potentially create more monotonic actions. As such, the cross-layer analysis subsystem 240 iteratively performs physical aggregation and updating with the optimal control unit module 240 until the GDG converges.

Figure 3:
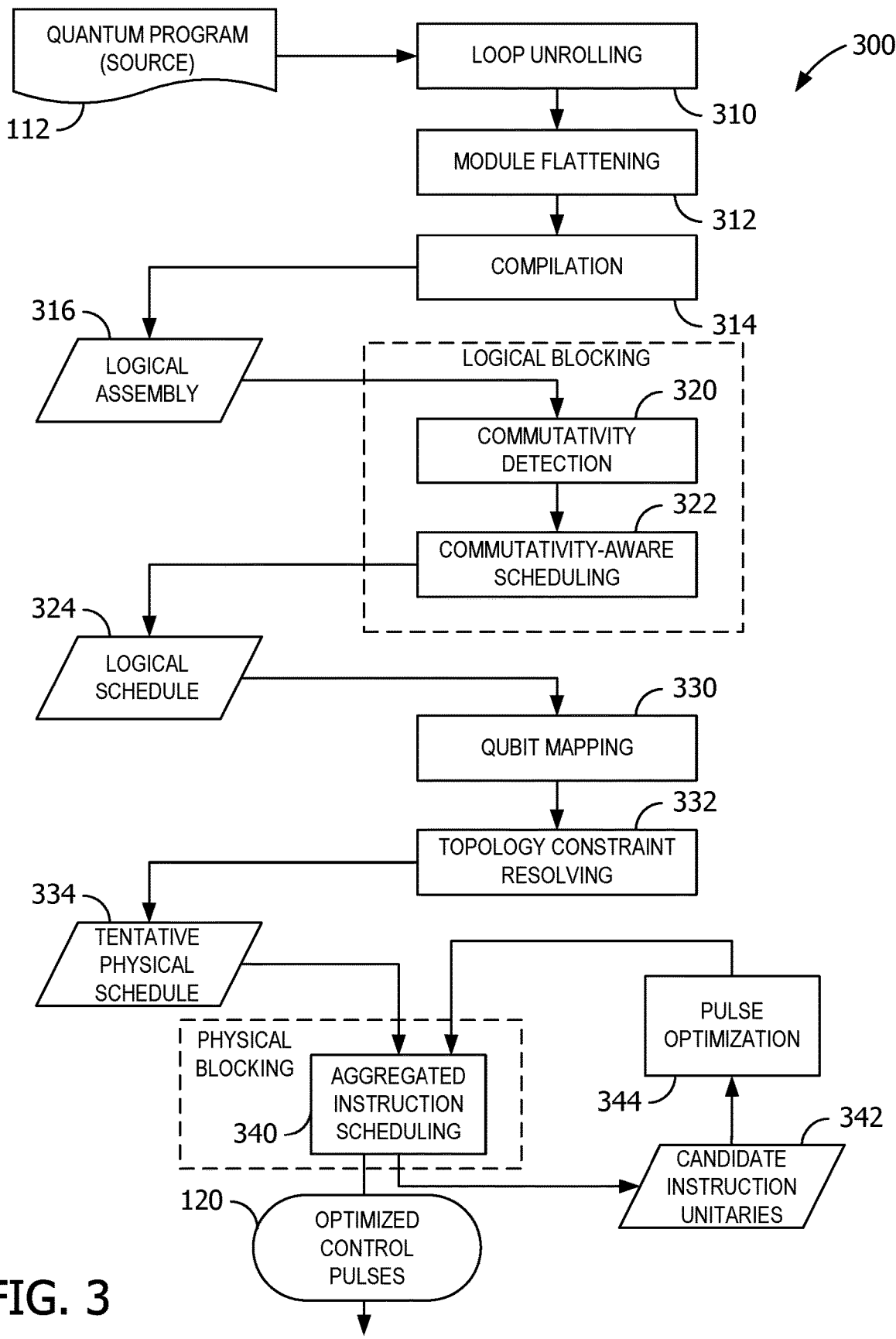

FIG. 3 is a flow chart illustrating an example method 300 for optimizing the compilation of the quantum program 112 for execution on the quantum computing device 130 shown in FIG. 1. In the example embodiment, the method 300 is performed on the control computing device 110 (e.g., by the subsystems and modules of compilation engine 114). The compilation engine 114 starts with the source code of the quantum program 112. The compilation engine 114 performs loop unrolling on the quantum program 112 (see operation 310), as described with respect to the loop unrolling module 212 of FIG. 2, as well as module flattening (see operation 312), as described with respect to the module flattening module 214 of FIG. 2. The compilation engine 114 then compiles the quantum program 112 into logical assembly 316 (operation 314). In the example embodiment, this compilation is performed with the StaffCC compiler. The logical assembly 316 can be in any quantum assembly such as, for example, QASM, OpenQASM, XACC intermediate representation (IR), or LLVM.

Figure 4A:
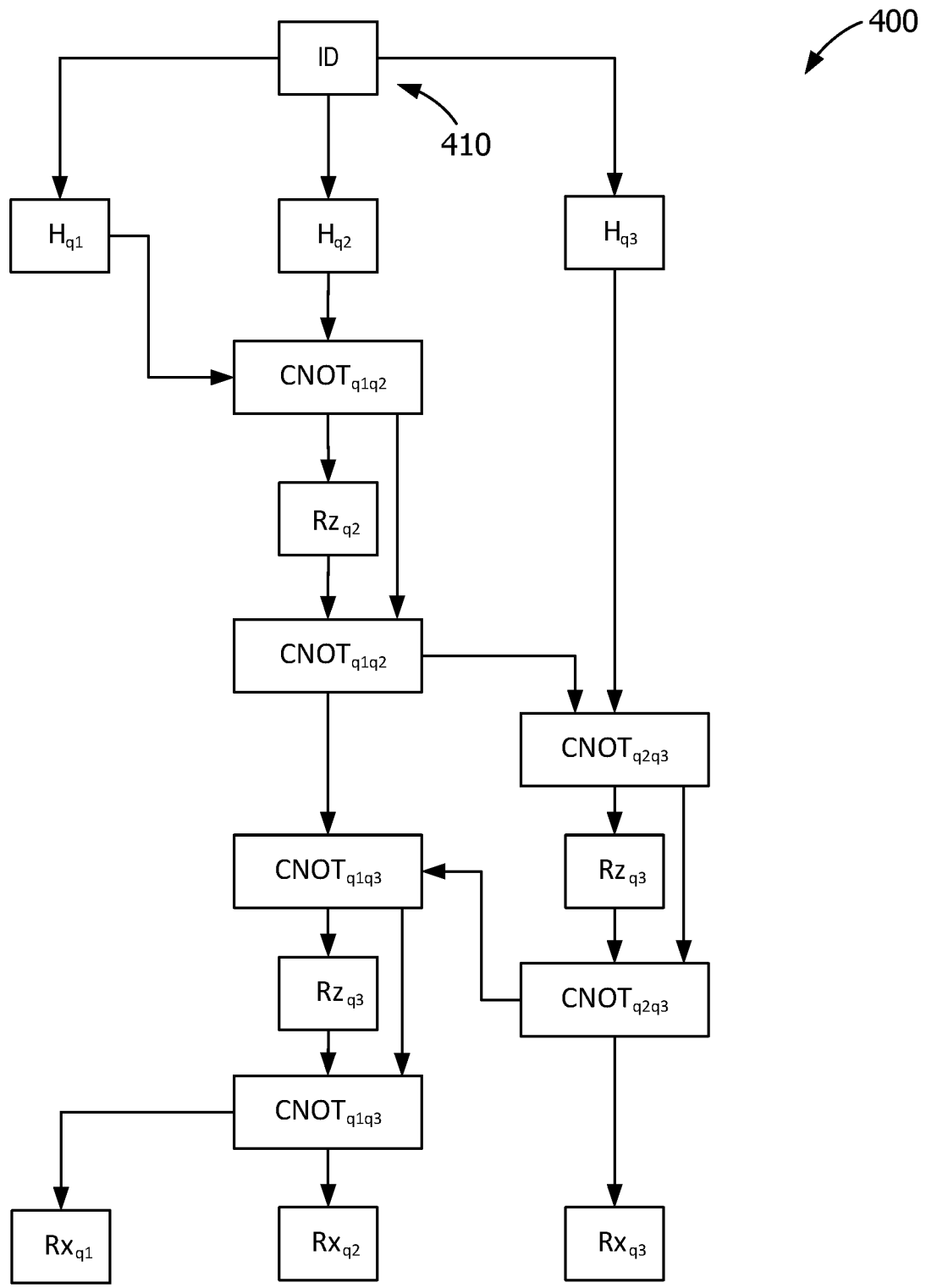
FIG. 4A-4D illustrate example gate dependency graphs generated by the compilation engine of FIG. 1.

In the example embodiment, the compilation engine 114 performs logical blocking on logical assembly 316 generated from the previous operations. The logical assembly 316 can be abstracted as a gate dependence graph. FIG. 4A illustrates an example gate dependency graph, GDG 400. The example GDG 400 is constructed from a quantum circuit representing the quantum approximate optimization algorithm ("QAOA") that solves the MAX_CUT problem for a triangle. The circuit is decomposed into a standard gate set. An identity instruction 410 is inserted as a virtual root for every GDG to connect instructions at depth 0. Because this virtual root is the identity instruction 410, it does not interfere with the computational result or latency. Further, each path is labelled by a corresponding qubit name. In the example shown here, the GDG 400 represents the quantum program after the module flattening of operation 312 (e.g., logical assembly 316, a "flattened" quantum program).

The main difference between a quantum GDG and a classical program dependence graph ("PDG") is that quantum commutation rules apply in a quantum GDG. In a quantum GDG, consecutive commuting gates do not have parent-child relations and can be scheduled in any order. GDG provides a flexible and systematic way to search a quantum circuit, which serves as a visualization tool. The instructions that can be merged are direct predecessors to each other, or commutative siblings. The GDG may be traversed to look for instructions that can be merged. The search is efficient because the product of two 4×4 (2-qubit) non-diagonal unitaries that only share one qubit cannot be diagonal. As such, for each instruction, the 2-qubit chain after it is searched. More specifically, and referring now to FIGS. 3 and 4A, the compilation engine 114 relies on several commutation relations when performing logical blocking. Important commutation relations include: two quantum gates applied on different qubits commute; the control bit of a CNOT gate commutes with Z rotations; two CNOT gates commute if the control of one is not the target of the other; and two gates representing diagonal unitary operators commute (e.g., Z rotations are diagonal unitaries). Other commutation rules may also be applied by the compilation engine 114. In the example embodiment, commutation rules between two gates A, and B are resolved by explicitly checking the equality of unitary operators AB and BA.

Figure 4B:
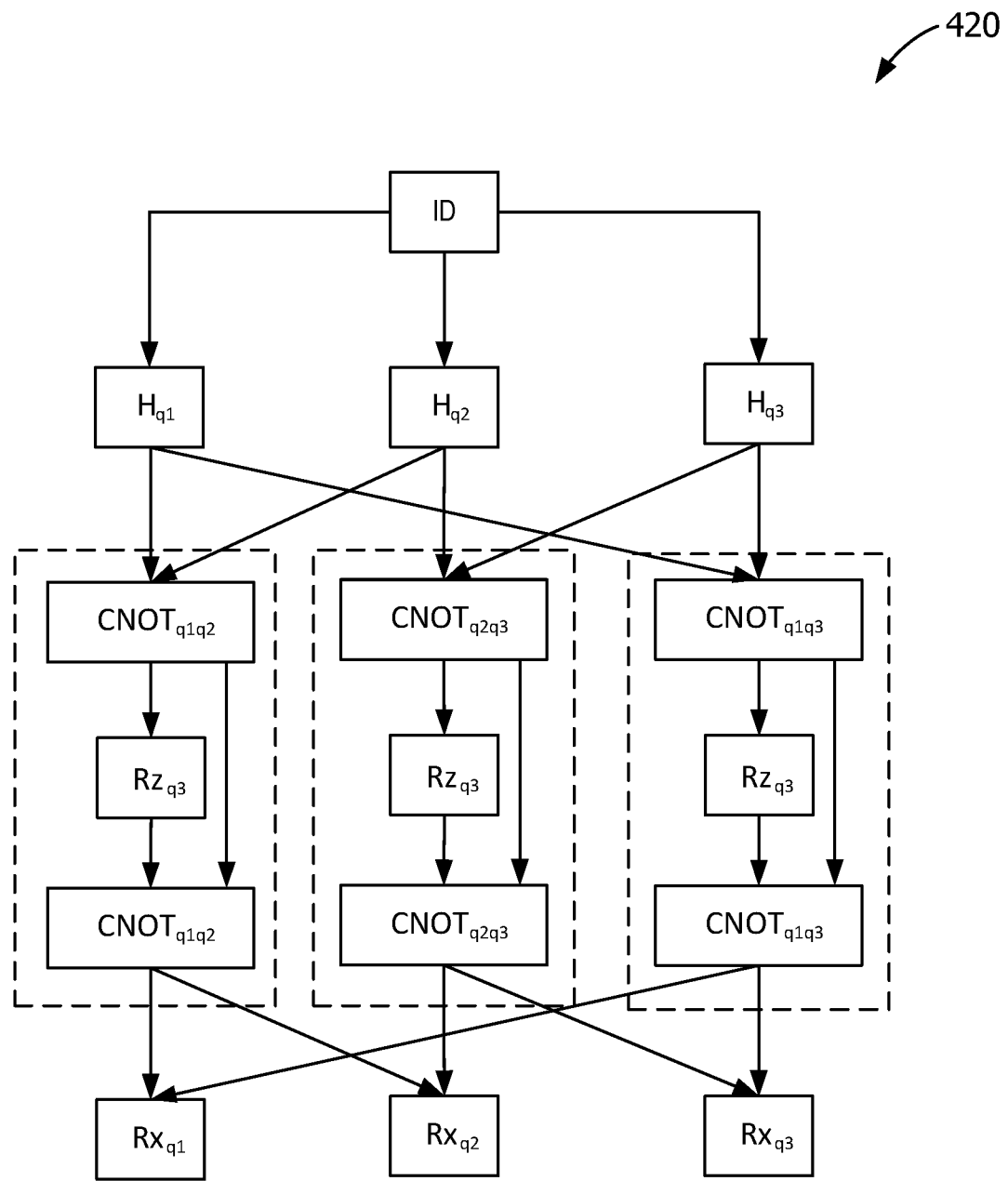

In the example shown in FIG. 4A, the CNOT-Rz-CNOT structures shown here commute with each other, but each CNOT and Rz in these structures does not commute. As such, the compilation engine 114 identifies each of the three CNOT-Rz-CNOT sets of instructions as blocks of instructions that are available for commutation. FIG. 4B illustrates an updated GDG 420 from this example. In the example embodiment, the GDG 420 represents the state of the GDG 400 after the commutativity detection of operation 320 is performed by the compilation engine 114. By detecting commutativity of the CNOT-Rz-CNOT instructions, the compilation engine 114 transforms the GDG 400 of FIG. 4A into the GDG 420 shown here. This configuration allows more flexibility in scheduling. After contracting the consecutive CNOT-Rz-CNOT instructions in GDG 420, the compiler is able to schedule new commuting CNOT-Rz-CNOT instructions in any order. In contrast, with the GDG 400 shown in FIG. 4A, scheduling options are limited.

Referring again to FIG. 3, the compilation engine 114 then performs commutativity-aware scheduling (see operation 322). To perform this scheduling, in the example embodiment, the compilation engine 114 first assigns a non-positive priority value to each instruction. The priority value of an instruction is the negative of its execution starting time. For the priority value for an instruction, G, the scheduler finds all of G's parents in the GDG 420 and, for each parent, the scheduler subtracts its latency from its priority value as a potential priority value for G. G is then assigned the minimal potential priority value of all its parents. For the identity instruction 410 at the virtual root of the GDG 420, a priority value of zero and a latency value of zero are assigned. It is possible that commuting instructions conflict with each other (e.g., the three CNOT-Rz-CNOT instructions of FIG. 4B have the same priority value but cannot be scheduled at the same time).

Figures 5A, 5B:
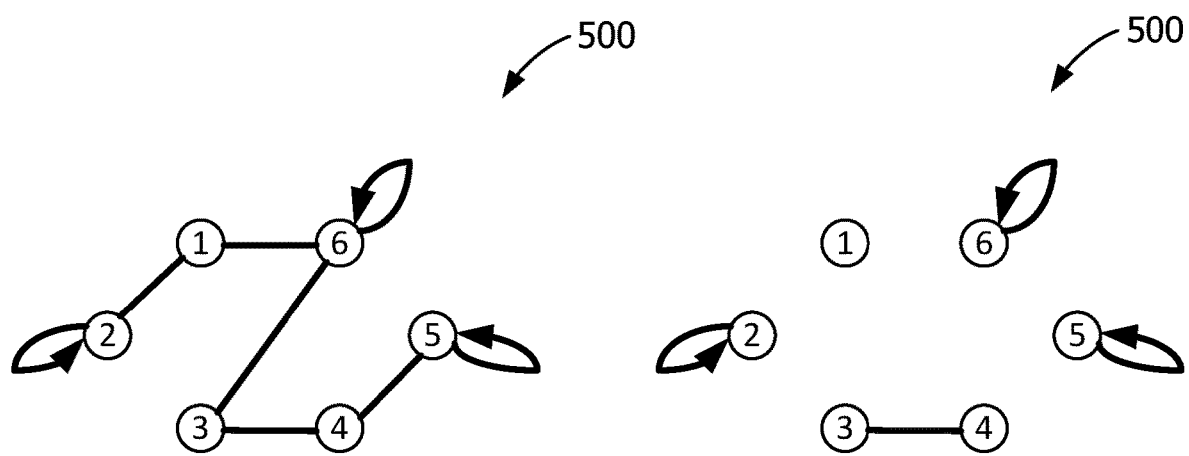
Figures 5C, 5D:
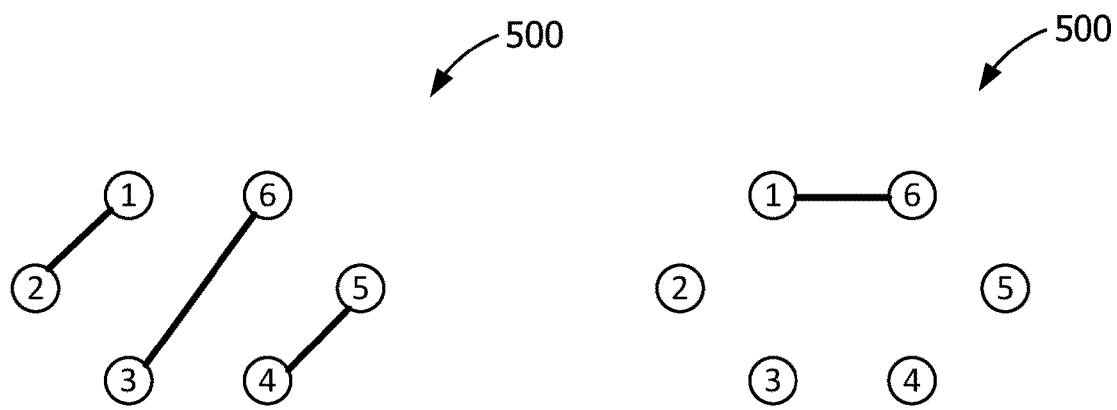

To schedule those conflicting instructions, the compilation engine 114 forms a computational graph, $G_c$, with qubits as vertices and gates as edges (e.g., 1-qubit gates being self-loops on a single vertex). If the computational graph, $G_c$, is a matching of itself, then no scheduling is needed since all gates can be executed at the same time. For cases where $G_c$ is not a matching, the compilation engine 114 performs a conflict resolution procedure for scheduling. More specifically, the compilation engine 114 finds the maximal cardinality matching of $G_c$, assigns those edges higher priority value, and proceeds to the rest of the graph. FIGS. 5A-5D illustrate stages of an example computational graph 500 used by the compilation engine 114 to schedule conflicting instructions. In the example embodiment, the underlying quantum system is a 6-qubit device, and all instructions have the same latency. The compilation engine 114 performs one or more rounds of graph analysis, each round finding a maximal matching of non-adjacent edges and then schedules those edges. The process repeats for the remaining edges, each time finding a maximal matching of non-adjacent remaining edges and then scheduling those edges. In FIG. 5A, all conflicting operations are included. In FIG. 5B, the conflict resolution has identified four edges, three of which are 1-qubit self-loops (e.g., for qubits 2, 5, and 6), as well as a 2-qubit operation involving qubits 3 and 4. As such, these four operations do not conflict with each other and are scheduled first. In FIG. 5C, the conflict resolution process next identifies three remaining edges, 1 and 2, 3 and 6, and 4 and 5. These three operations do not conflict with each other and are scheduled next. In a third round represented by FIG. 5D, the conflict resolution process identifies only one remaining operation and this operation is scheduled last. The compilation engine 114 performs the conflict resolution procedure for every group of conflicting instructions encountered. After all instructions are assigned a priority value, the compilation engine 114 schedules greedily with priority value from high to low.

In the example embodiment, the compilation engine 114 is operating to maximize parallelism and not to minimize the number of SWAP gates in the backend. In certain quantum computing environments such as the example superconducting architecture, SWAP gates are generally high cost, but without optimal control, and can, in some situations, be beneficial in reducing latency.

Figure 4C:
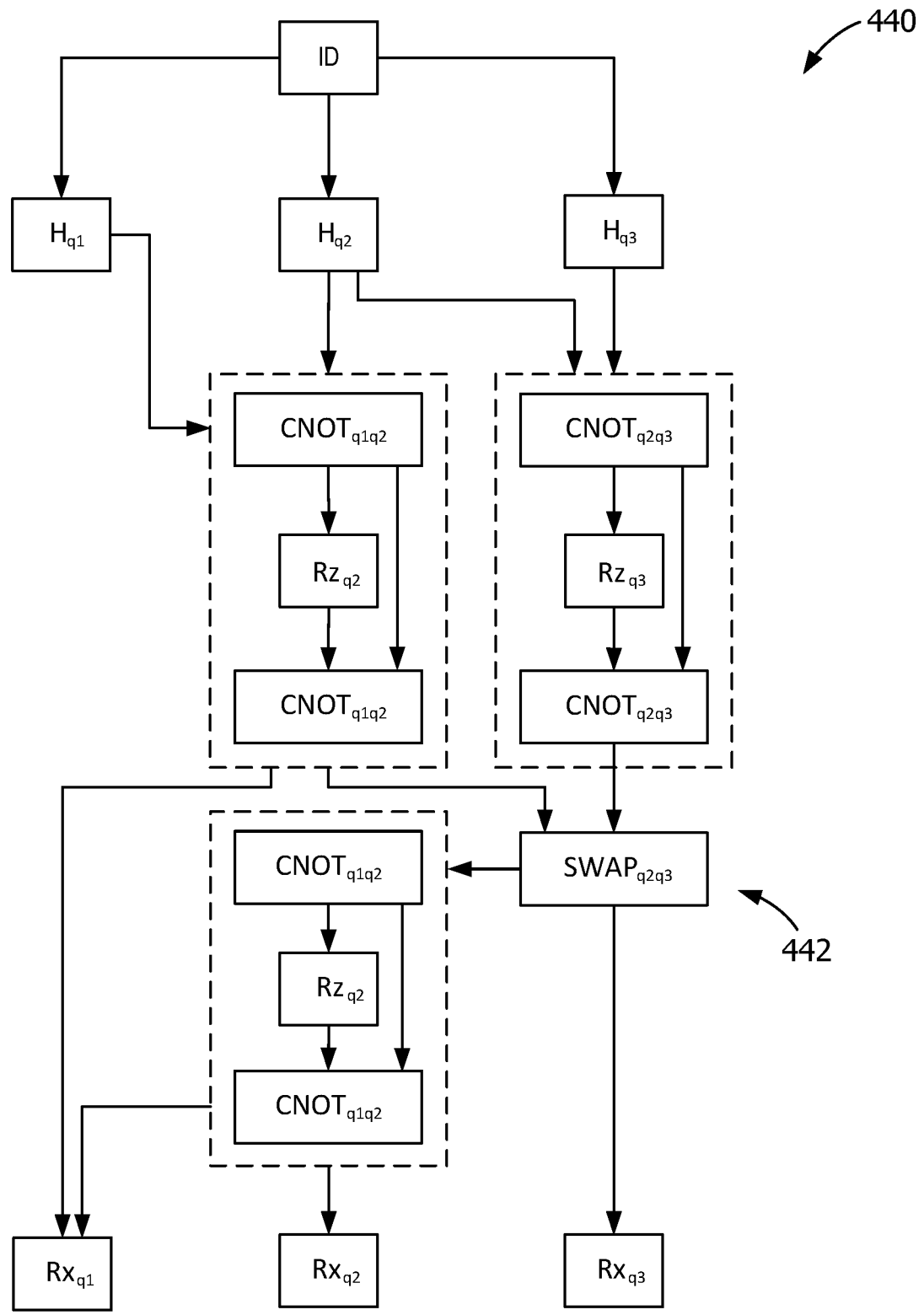

Returning again to FIG. 3, after commutativity-aware scheduling of operation 322, the compilation engine 114 has a logical schedule 324 that has been optimized for commutativity. The compilation engine 114 performs qubit mapping and topology constraint resolution (see operations 330, 332), as described above. Qubit mapping and topology constraint resolution may lead to changes in the GDG 420, including possible introduction of one or more SWAP gates. FIG. 4C illustrates an updated GDG 440 from this example. In the example embodiment, the GDG 440 represents the state of the GDG 400 after the commutativity-aware scheduling of operation 322, the qubit mapping of operation 330, and the topology constraint resolution of operation 332 are performed by the compilation engine 114. In the example embodiment, a SWAP gate 442 has been added to the GDG 440.

Referring again to FIG. 3, the qubit mapping and topology constraint resolution of operations 330, 332 have generated a tentative physical schedule 334 for the operations of the quantum program 112. At this stage, the compilation engine 114 enters another round of physical blocking with aggregated instruction scheduling 340 and pulse optimization 344. In the example embodiment, the compilation engine 114 aggregates two consecutive instructions in this stage of instruction aggregation if (A) the two instructions overlap (e.g., share some common qubits) and (B) one is the parent of the other on every qubit path they share or they are siblings. In addition, the number of qubits in an aggregated instruction may be limited in light of the performance limitations of the optimal control unit module 242. The compilation engine 114 performs physical blocking with aggregated instruction scheduling (see operation 340) and pulse optimization (see operation 344), as described above with respect to FIG. 2, looping until the compilation engine 114 identifies no further aggregations to perform.

Further, the compilation engine 114 also performs additional commutativity detection at this stage. One example commutation of instructions that may be performed is aggregated instructions representing diagonal unitaries. Diagonal unitaries are widely used in decomposition methods of quantum chemistry applications and near-term optimization algorithms. As such, the compilation engine 114 traverses the GDG 460 searching for 2-qubit instructions representing diagonal unitaries greedily in the action space described above are aggregated to extract more commutativity, merging those whose product is diagonal.

Figure 4D:
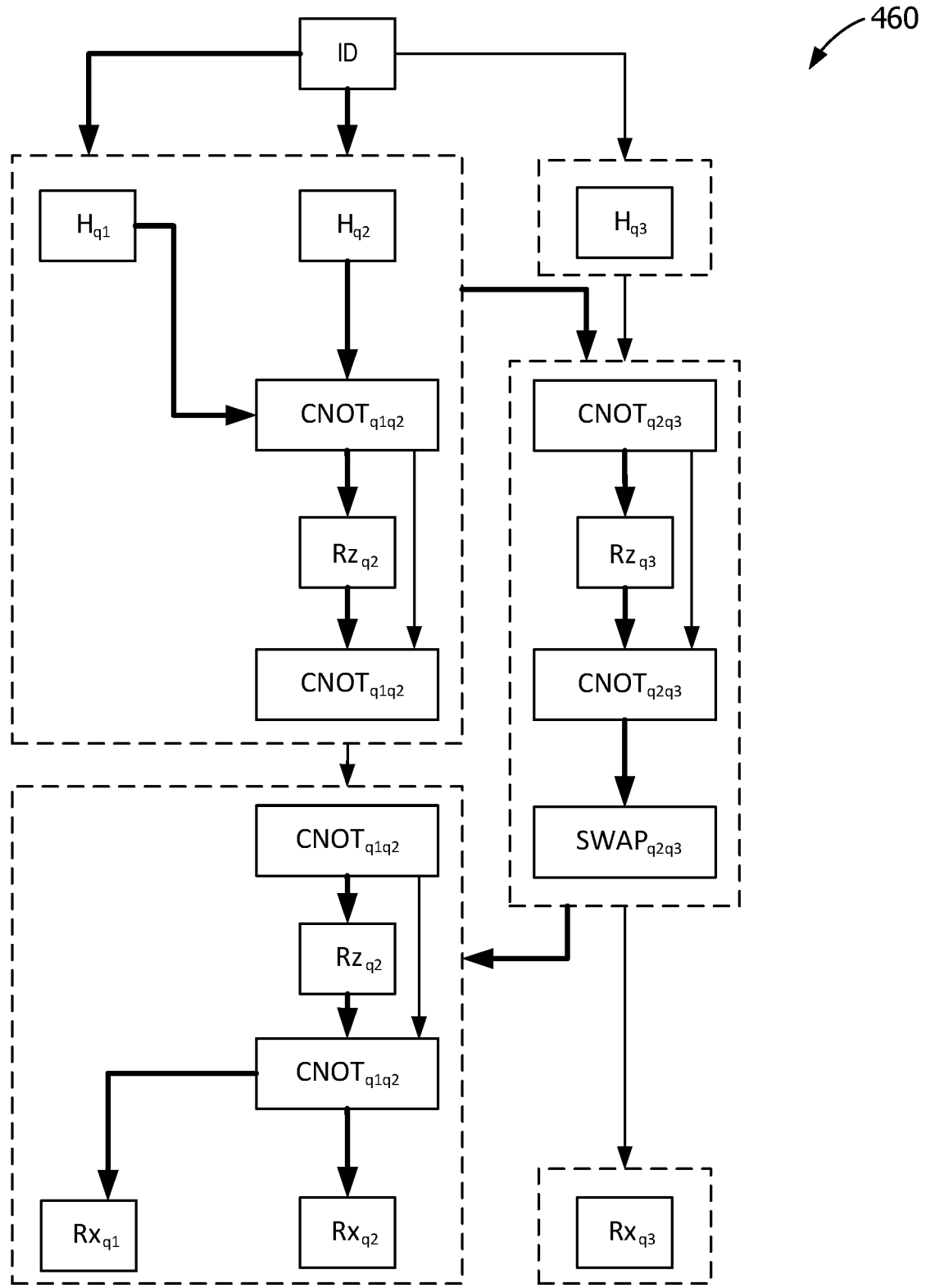

FIG. 4D illustrates an updated GDG 460 from this example. In the example embodiment, the GDG 460 represents the state of the GDG 400 after the physical blocking and pulse optimization of operations 340, 344 are performed by the compilation engine 114, where bold arrows indicate the critical paths. In the example embodiment, after customizing the final aggregated instruction set, the updated GDG 460 is optimized for both parallelism and for pulse generation. At this stage, the compilation engine 114 computes the unitary transformation of which the aggregated instructions represent, which is then sent to the optimal control unit module 242 for pulse optimization 344. The optimal control unit module 242 optimizes control pulses for the underlying quantum hardware (e.g., the quantum processor 134). The optimized control pulses 120 can generate the desired unitary operation using stochastic gradient descending. The optimal control unit module 242 returns the control pulses above the fidelity threshold that also minimize circuit latency.

Referring again to FIG. 3, upon completion, the compilation engine 114 produces the optimized control pulses 120 for transmission to the signal generator 118, which may then execute the control pulses on the quantum processor 132.

In some embodiments, a quantum computing system for compiling and executing instructions on a quantum processor comprises the quantum processor including a plurality of qubits, a classical memory including a quantum program, the quantum program defines a plurality of instructions in a source language, and a classical processor communicatively coupled to the classical memory. The memory includes computer-executable instructions that, when executed by the classical processor, cause the classical processor to: (i) compile the quantum program into logical assembly instructions in an intermediate language; (ii) aggregate the logical assembly instructions together into a plurality of logical blocks of instructions; (iii) generate a logical schedule for the quantum program based on commutativity between the plurality of logical blocks; (iv) generate a tentative physical schedule based on the logical schedule, the tentative physical schedule includes a mapping of the logical assembly instructions in the logical schedule onto the plurality of qubits of the quantum processor; (v) aggregate instructions together within the tentative physical schedule that do not reduce parallelism, thereby generating an updated physical schedule; (vi) generate optimized control pulses for the aggregated instructions of the quantum program; and (vii) execute the quantum program on the quantum processor with the optimized control pulses and the updated physical schedule.

In some embodiments, the instructions further cause the processor to generate a gate dependence graph for the quantum program from the logical assembly instructions, wherein aggregating sets of logical assembly instructions together further includes determining commutativity in the gate dependency graph, and wherein the aggregating is based on aggregation rules defined on the gate dependence graph. In some embodiments, determining commutativity in the gate dependency graph includes forming one or more intermediate aggregated instructions within the gate dependency graph. In some embodiments, the instructions further cause the processor to determine priority values for each instruction in the quantum program by: (a) identifying, for a particular instruction, each parent of the particular instruction from the gate dependency graph; (b) for each identified parent of the particular instruction, subtracting a latency of the parent from a priority value of the parent, thereby identifying a potential priority value for the particular instruction; (c) assigning a minimal potential priority value to the particular instruction from the identified potential priority values of the identified parents; and (d) schedule each instruction in the quantum program based on the assigned priority value. In some embodiments, aggregating instructions together in the tentative physical schedule comprises: (a) identifying a monotonic action involving aggregation of two or more instructions within the gate dependence graph that does not delay critical paths within the gate dependence graph; (b) aggregating the two or more instructions within the gate dependence graph; and (c) updating the latency of each aggregated instruction; and scheduling a circuit of aggregated instructions based on the gate dependence graph. In some embodiments, executing the quantum program further includes transmitting control pulse sequences to the quantum processor based on the circuit of aggregated instructions. In some embodiments, aggregating the logical assembly instructions further includes aggregating a first set of logical assembly instructions the product of which are diagonal unitaries.

In some embodiments, a computer-implemented method for compiling instructions for a quantum computer is provided. The method is implemented using a classical processor in communication with a classical memory. The method comprises (i) receiving a quantum program from a user, the quantum program defining a plurality of instructions in a source language; (ii) compiling the quantum program into logical assembly instructions in an intermediate language; (iii) aggregating the logical assembly instructions together into a plurality of logical blocks of instructions; (iv) generating a logical schedule for the quantum program based on commutativity between the plurality of logical blocks; (v) generating a tentative physical schedule based on the logical schedule, the tentative physical schedule including a mapping of the logical assembly instructions in the logical schedule onto a plurality of qubits of a quantum processor; (vi) aggregating instructions together in the tentative physical schedule that do not reduce parallelism, thereby generating an updated physical schedule; (vii) generating optimized control pulses for the aggregated instructions of the quantum program; and (viii) executing the quantum program on the quantum processor with the optimized control pulses and the updated physical schedule.

In some embodiments, the method further includes generating a gate dependence graph for the quantum program from the logical assembly instructions, wherein aggregating sets of logical assembly instructions together further includes determining commutativity in the gate dependency graph, wherein the aggregating is based on aggregation rules defined on the gate dependency graph. In some embodiments, determining commutativity in the gate dependency graph includes forming one or more intermediate aggregated instructions within the gate dependency graph. In some embodiments, the method further includes determining priority values for each instruction in the quantum program by: (a) identifying, for a particular instruction, each parent of the particular instruction from the gate dependency graph; (b) for each identified parent of the particular instruction, subtracting a latency of the parent from a priority value of the parent, thereby identifying a potential priority value for the particular instruction; and (c) assigning a minimal potential priority value to the particular instruction from the identified potential priority values of the identified parents; and scheduling each instruction in the quantum program based on the assigned priority value. In some embodiments, aggregating instructions together in the tentative physical schedule comprises: (a) identifying a monotonic action involving aggregation of two or more instructions within the gate dependence graph that does not delay critical paths within the gate dependence graph; (b) aggregating the two or more instructions within the gate dependence graph; (c) updating the latency of each aggregated instruction; and (d) scheduling a circuit of aggregated instructions based on the gate dependence graph. In some embodiments, executing the quantum program further includes transmitting control pulse sequences to the quantum processor based on the circuit of aggregated instructions. In some embodiments, aggregating the logical assembly instructions further includes aggregating a first set of logical assembly instructions the product of which are diagonal unitaries.

In some embodiments, a non-transitory computer-readable storage media having computer-executable instructions embodied thereon is provided. When executed by at least one classical processor, the computer-executable instructions cause the classical processor to: (i) receive a quantum program from a user, the quantum program defining a plurality of instructions in a source language; (ii) compile the quantum program into logical assembly instructions in an intermediate language; (iii) aggregate the logical assembly instructions together into a plurality of logical blocks of instructions; (iv) generate a logical schedule for the quantum program based on commutativity between the plurality of logical blocks; (v) generate a tentative physical schedule based on the logical schedule, the tentative physical schedule including a mapping of the logical assembly instructions in the logical schedule onto a plurality of qubits of a quantum processor; (vi) aggregate instructions together in the tentative physical schedule that do not reduce parallelism, thereby generating an updated physical schedule; (vii) generate optimized control pulses for the aggregated instructions of the quantum program; and (viii) execute the quantum program on the quantum processor with the optimized control pulses and the updated physical schedule.

In some embodiments, the computer-executable instructions further cause the classical processor to: generate a gate dependence graph for the quantum program from the logical assembly instructions, wherein aggregating sets of logical assembly instructions together further includes determining commutativity in the gate dependency graph, wherein the aggregating is based on aggregation rules defined on the gate dependency graph. In some embodiments, determining commutativity in the gate dependency graph includes forming one or more intermediate aggregated instructions within the gate dependency graph. In some embodiments, the computer-executable instructions further cause the classical processor to: determine priority values for each instruction in the quantum program by: (a) identifying, for a particular instruction, each parent of the particular instruction from the gate dependency graph; (b) for each identified parent of the particular instruction, subtracting a latency of the parent from a priority value of the parent, thereby identifying a potential priority value for the particular instruction; and (c) assigning a minimal potential priority value to the particular instruction from the identified potential priority values of the identified parents; and schedule each instruction in the quantum program based on the assigned priority value. In some embodiments, aggregating instructions together in the tentative physical schedule comprises: (a) identifying a monotonic action involving aggregation of two or more instructions within the gate dependence graph that does not delay critical paths within the gate dependence graph; (b) aggregating the two or more instructions within the gate dependence graph; (c) updating the latency of each aggregated instruction; and (d) scheduling a circuit of aggregated instructions based on the gate dependence graph. In some embodiments, aggregating the logical assembly instructions further includes aggregating a first set of logical assembly instructions the product of which are diagonal unitaries.

A quantum compilation engine for compiling a quantum program to be executed on quantum processor that includes a plurality of qubits is provided. The quantum compilation engine comprises: a classical memory including the quantum program, the quantum program defines a plurality of instructions in a source language; and a classical processor communicatively coupled to the memory. The memory includes computer-executable instructions that, when executed by the classical processor, cause the classical processor to: (i) compile the quantum program into logical assembly instructions in an intermediate language; (ii) aggregate the logical assembly instructions together into a plurality of logical blocks of instructions; (iii) generate a logical schedule for the quantum program based on commutativity between the plurality of logical blocks; (iv) generate a tentative physical schedule based on the logical schedule, the tentative physical schedule includes a mapping of the logical assembly instructions in the logical schedule onto the plurality of qubits of the quantum processor; (v) aggregate instructions together within the tentative physical schedule that do not reduce parallelism, thereby generating an updated physical schedule; and (vi) generate a pulse specification based on the updated physical schedule.

As will be appreciated based on the foregoing specification, the above-described embodiments of the disclosure may be implemented using computer programming or engineering techniques including computer software, firmware, hardware or any combination or subset thereof, wherein the technical effect is to compile and optimize a quantum program for a quantum processor. Any such resulting program, having computer-readable code means, may be embodied or provided within one or more computer-readable media, thereby making a computer program product, (i.e., an article of manufacture), according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

These conventional computer programs (also known as programs, software, software applications, "apps", or code) include machine instructions for a conventional programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A quantum computing system for compiling and executing instructions on a quantum processor, the quantum computing system comprising:
   the quantum processor including a plurality of qubits;
   a classical memory including a quantum program, the quantum program defines a plurality of instructions in a source language; and
   a classical processor communicatively coupled to the classical memory, the classical memory including computer-executable instructions that, when executed by the classical processor, cause the classical processor to:
- compile the quantum program into logical assembly instructions in an intermediate language;
- aggregate the logical assembly instructions together into a plurality of logical blocks of instructions;
- generate a logical schedule for the quantum program based on commutativity between the plurality of logical blocks;
- generate a tentative physical schedule based on the logical schedule, the tentative physical schedule includes a mapping of the logical assembly instructions in the logical schedule onto the plurality of qubits of the quantum processor;
- aggregate instructions together within the tentative physical schedule that do not reduce parallelism, thereby generating an updated physical schedule;
- generate optimized control pulses for the aggregated instructions of the quantum program; and
- execute the quantum program on the quantum processor with the optimized control pulses and the updated physical schedule.

2. The quantum computing system of claim 1, wherein the instructions further cause the classical processor to:
- generate a gate dependence graph for the quantum program from the logical assembly instructions,
- wherein aggregating sets of logical assembly instructions together further includes determining commutativity in the gate dependency graph, wherein the aggregating is based on aggregation rules defined on the gate dependence graph.

3. The quantum computing system of claim 2, wherein determining commutativity in the gate dependency graph includes forming one or more intermediate aggregated instructions within the gate dependency graph.

4. The quantum computing system of claim 2, wherein the instructions further cause the classical processor to:
- determine priority values for each instruction in the quantum program by:
  - identifying, for a particular instruction, each parent of the particular instruction from the gate dependency graph;
  - for each identified parent of the particular instruction, subtracting a latency of the parent from a priority value of the parent, thereby identifying a potential priority value for the particular instruction; and
  - assigning a minimal potential priority value to the particular instruction from the identified potential priority values of the identified parents; and
- schedule each instruction in the quantum program based on the assigned priority value.

5. The quantum computing system of claim 2, wherein aggregating instructions together in the tentative physical schedule comprises:
- identifying a monotonic action involving aggregation of two or more instructions within the gate dependence graph that does not delay critical paths within the gate dependence graph;
- aggregating the two or more instructions within the gate dependence graph;
- updating a latency of each aggregated instruction; and
- scheduling a circuit of aggregated instructions based on the gate dependence graph.

6. The quantum computing system of claim 5, wherein executing the quantum program further includes transmitting control pulse sequences to the quantum processor based on the circuit of aggregated instructions.

7. The quantum computing system of claim 1, wherein aggregating the logical assembly instructions further includes aggregating a first set of logical assembly instructions, a product of which are diagonal unitaries.

8. A computer-implemented method for compiling instructions for a quantum computer, the method is implemented using a classical processor in communication with a classical memory, the computer-implemented method comprising:
- receiving a quantum program from a user, the quantum program defining a plurality of instructions in a source language;
- compiling the quantum program into logical assembly instructions in an intermediate language;
- aggregating the logical assembly instructions together into a plurality of logical blocks of instructions;
- generating a logical schedule for the quantum program based on commutativity between the plurality of logical blocks;
- generating a tentative physical schedule based on the logical schedule, the tentative physical schedule including a mapping of the logical assembly instructions in the logical schedule onto a plurality of qubits of a quantum processor;
- aggregating instructions together in the tentative physical schedule that do not reduce parallelism, thereby generating an updated physical schedule;
- generating optimized control pulses for the aggregated instructions of the quantum program; and
- executing the quantum program on the quantum processor with the optimized control pulses and the updated physical schedule.

9. The computer-implemented method of claim 8, further comprising:
- generating a gate dependence graph for the quantum program from the logical assembly instructions,
- wherein aggregating sets of logical assembly instructions together further includes determining commutativity in the gate dependency graph, wherein the aggregating is based on aggregation rules defined on the gate dependency graph.

10. The computer-implemented method of claim 9, wherein determining commutativity in the gate dependency graph includes forming one or more intermediate aggregated instructions within the gate dependency graph.

11. The computer-implemented method of claim 9, further comprising:
- determining priority values for each instruction in the quantum program by:
  - identifying, for a particular instruction, each parent of the particular instruction from the gate dependency graph;
  - for each identified parent of the particular instruction, subtracting a latency of the parent from a priority value of the parent, thereby identifying a potential priority value for the particular instruction; and
  - assigning a minimal potential priority value to the particular instruction from the identified potential priority values of the identified parents; and
- scheduling each instruction in the quantum program based on the assigned priority value.

12. The computer-implemented method of claim 9, wherein aggregating instructions together in the tentative physical schedule comprises:

identifying a monotonic action involving aggregation of two or more instructions within the gate dependence graph that does not delay critical paths within the gate dependence graph;

aggregating the two or more instructions within the gate dependence graph;

updating a latency of each aggregated instruction; and scheduling a circuit of aggregated instructions based on the gate dependence graph.

13. The computer-implemented method of claim 12, wherein executing the quantum program further includes transmitting control pulse sequences to the quantum processor based on the circuit of aggregated instructions.

14. The computer-implemented method of claim 8, wherein aggregating the logical assembly instructions further includes aggregating a first set of logical assembly instructions, a product of which are diagonal unitaries.

15. A non-transitory computer-readable storage media having computer executable instructions embodied thereon, wherein when executed by at least one classical processor, the computer-executable instructions cause the classical processor to:

receive a quantum program from a user, the quantum program defining a plurality of instructions in a source language;

compile the quantum program into logical assembly instructions in an intermediate language;

aggregate the logical assembly instructions together into a plurality of logical blocks of instructions;

generate a logical schedule for the quantum program based on commutativity between the plurality of logical blocks;

generate a tentative physical schedule based on the logical schedule, the tentative physical schedule including a mapping of the logical assembly instructions in the logical schedule onto a plurality of qubits of a quantum processor;

aggregate instructions together in the tentative physical schedule that do not reduce parallelism, thereby generating an updated physical schedule;

generate optimized control pulses for the aggregated instructions of the quantum program; and execute the quantum program on the quantum processor with the optimized control pulses and the updated physical schedule.

16. The non-transitory computer-readable storage media of claim 15, wherein the computer-executable instructions further cause the classical processor to:

generate a gate dependence graph for the quantum program from the logical assembly instructions, wherein aggregating sets of logical assembly instructions together further includes determining commutativity in the gate dependency graph, wherein the aggregating is based on aggregation rules defined on the gate dependency graph.

17. The non-transitory computer-readable storage media of claim 16, wherein determining commutativity in the gate dependency graph includes forming one or more intermediate aggregated instructions within the gate dependency graph.

18. The non-transitory computer-readable storage media of claim 16, wherein the computer-executable instructions further cause the classical processor to:

determine priority values for each instruction in the quantum program by:

identifying, for a particular instruction, each parent of the particular instruction from the gate dependency graph;

for each identified parent of the particular instruction, subtracting a latency of the parent from a priority value of the parent, thereby identifying a potential priority value for the particular instruction;

assigning a minimal potential priority value to the particular instruction from the identified potential priority values of the identified parents; and schedule each instruction in the quantum program based on the assigned priority value.

19. The non-transitory computer-readable storage media of claim 16, wherein aggregating instructions together in the tentative physical schedule comprises:

identifying a monotonic action involving aggregation of two or more instructions within the gate dependence graph that does not delay critical paths within the gate dependence graph;

aggregating the two or more instructions within the gate dependence graph;

updating a latency of each aggregated instruction; and scheduling a circuit of aggregated instructions based on the gate dependence graph.

20. The non-transitory computer-readable storage media of claim 15, wherein aggregating the logical assembly instructions further includes aggregating a first set of logical assembly instructions, a product of which are diagonal unitaries.

21. A quantum compilation engine for compiling a quantum program to be executed on quantum processor that includes a plurality of qubits, the quantum compilation engine comprising:

a classical memory including the quantum program, the quantum program defines a plurality of instructions in a source language; and a classical processor communicatively coupled to the classical memory, the classical memory including computer-executable instructions that, when executed by the classical processor, cause the classical processor to:

compile the quantum program into logical assembly instructions in an intermediate language;

aggregate the logical assembly instructions together into a plurality of logical blocks of instructions;

generate a logical schedule for the quantum program based on commutativity between the plurality of logical blocks;

generate a tentative physical schedule based on the logical schedule, the tentative physical schedule includes a mapping of the logical assembly instructions in the logical schedule onto the plurality of qubits of the quantum processor;

aggregate instructions together within the tentative physical schedule that do not reduce parallelism, thereby generating an updated physical schedule; and generate a pulse specification based on the updated physical schedule.

* * * * *